(12) United States Patent
Nakaizumi

(10) Patent No.: US 6,388,473 B1
(45) Date of Patent: May 14, 2002

(54) LOGIC PRODUCT CIRCUIT

(75) Inventor: Kazuo Nakaizumi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/605,335

(22) Filed: Jun. 27, 2000

(30) Foreign Application Priority Data

Jun. 28, 1999 (JP) .......................................... 11-182513
Jul. 30, 1999 (JP) .......................................... 11-218204

(51) Int. Cl.[7] ........................................... H03K 19/082

(52) U.S. Cl. ...................... 326/110; 326/109; 326/101

(58) Field of Search ................................ 326/110, 109, 326/112, 119, 121, 101, 102, 103

(56) References Cited

U.S. PATENT DOCUMENTS 4,716,308 A * 12/1987 Matsuo et al. .............. 307/303
5,986,478 A * 11/1999 Ohashi ........................ 326/104

* cited by examiner

Primary Examiner—Michael Tokar
Assistant Examiner—Anh Tran
(74) Attorney, Agent, or Firm—Darby & Darby

(57) ABSTRACT

A logic product circuit having a plurality of transistors arranged in a matrix; a plurality of input terminals; and a single output terminal. The transistors in each column are connected in a line, forming a transistor array, the transistor arrays are connected in parallel between the output terminal and the ground, each of the input terminals is connected to the inputs to the transistors in all the columns, and the transistors to which each input terminal is connected are arranged in different rows.

10 Claims, 11 Drawing Sheets

PRIOR ART

PRIOR ART

PRIOR ART

PRIOR ART

LOGIC PRODUCT CIRCUIT

BACKGROUND OF THE INVENTION

1. Field of the Invention

The present invention relates to an LSI circuit, and in particular, to a CMOS or Bi-CMOS logic product circuit.

This application is based on Japanese Patent Application Nos. Hei 11-182513 and Hei 11-218204, the contents of which are incorporated herein by reference.

2. Description of the Related Art

Of conventional logic product circuits comprising CMOSs or Bi-CMOSs, a four-input NAND circuit provides a transistor array in which four transistors are aligned in a line and are connected between output terminals of the four-input NAND circuit and GND.

The four input terminals of the four-input NAND circuit are connected to the inputs (gates) to four transistors. When signals at an H level are input to all the input terminals and all four transistors are turned on, the entire transistor array becomes conductive, the output terminals are connected to GND, and the output terminals are set to an L level. Thus, this circuit functions as a NAND circuit.

Other conventional four-input NAND circuits increase their electric current driving performance of their outputs by connecting a plurality of transistor arrays in parallel between the output terminals and GND. When an electric current is supplied at the same time to a certain number n of transistor arrays provided in parallel, n times the electric current output from the single transistor array can be gained.

The structure of the four-input NAND circuit will be explained with reference to FIG. 5. In this figure, INA, INB, INC, and IND are inputs to the four-input NAND circuit, and OUT is an output from the four-input NAND circuit.

QP51, QP52, QP53, and QP54 are P-channel transistors (hereinafter referred to as Pch transistors), and QN51, QN52, ..., QN59, QN5A, QN5B, and QN5C are N-channel transistors (hereinafter referred to as Nch transistors).

The Pch transistors QP51 to QP54 are connected between a power source voltage Vdd and an output terminal OUT in a parallel manner. That is, the sources of QP51 to QP54 are connected to the power source voltage Vdd, and the drains of QP51 to QP54 are connected to the output terminal OUT. The gates of QP51 to QP54 are connected to four input terminals INA, INB, INC, and IND, respectively.

The Nch transistors QN51 to QN54 are connected in a line, forming a transistor array TA51. In the transistor array TA51, the source of QN51 is connected to the drain of QN52, the source of QN52 is connected to the drain of QN53, and the source of QN53 is connected to the drain of QN54.

This transistor array TA51 is connected between the output terminal OUT and GND. That is, the drain of QN51 is connected to the output terminal OUT, and the source of QN54 is connected to GND.

Similarly, the Nch transistors QN55 to QN58 form a transistor array TA52, which is connected between the output terminal OUT and GND. Further, the Nch transistors QN59 to QN5C form a transistor array TA53, which is also connected between the output terminal OUT and GND.

The input terminals INA, INB, INC, and IND are connected to the gate terminals of the Pch transistors QP51, P52, QP53, and QP54, respectively.

When the input terminal INA is set to the L level, QP51 is turned on and becomes conductive so that the source voltage Vdd is output from the output terminal OUT. Similarly, when the input terminals INB, INC, and IND are set to the L level, QP52, QP53, and QP54 are turned on and become conductive so that the source voltage Vdd is output from the output terminal OUT. This output from the output terminal OUT is at the H level.

When a least one of the input terminals INA, INB, INC, and IND is set to the L level, a signal at the H level is output from the output terminal OUT.

The input terminal INA is connected to the gates of the Nch transistors QN51, QN55, and QN59 which are the nearest to the output terminal OUT. The input terminal INB is connected to the gates of Nch transistors QN52, QN56, and QN5A. The input terminal INC is connected to the gates of Nch transistors QN53, QN57, and QN5B. The input terminal IND is connected to the gates of the Nch transistors QN54, QN58, and QN5C which are the nearest to GND.

When the input terminal INA is set to the L level and the input terminals INB, INC, and IND are set to the H level, the Nch transistors QN51, QN55, and QN59 to which the input terminal INA is connected are turned off, the Nch transistors QN52, QN56, and QN5A to which the input terminal INB is connected, the Nch transistors QN53, QN57, and QN5B, and the Nch transistors QN54, QN58, and QN5C to which the input terminal IND is connected are turned on.

In this situation, because the transistor array TA51 includes the Nch transistor QN51 which has been turned off, the entire transistor array TA51 has been turned off. Similarly, because the transistor array TA52 includes the Nch transistor QN55 which has been turned offOFF, the entire transistor array TA52 has been turned off. Further, because the transistor array TA53 includes the Nch transistor QN59 which has been turned off, the entire transistor array TA53 has been turned off.

Because the transistor arrays TA51, TA52, and TA53 which are provided in parallel to each other between the output terminal OUT and GND have been turned off, the output terminal OUT is not connected to GND. Because the input terminal INA is at the L level, the Pch transistor QP51 has been turned on so that the source voltage Vdd is connected to the output terminal OUT.

Accordingly, when the input terminal INA is set to the L level and the input terminals INB, INC, and IND are set to the H level, the output terminal OUT outputs a signal at the H level.

When all the input terminals INA, INB, INC, and IND are set to the H level, the Nch transistors QN51, QN55, QN59, QN52, QN56, QN5A, QN53, QN57, QN5B, QN54, QN58, and QN5C are turned on. That is, the transistor arrays TA51, TA52, and TA53 become conductive so that the output terminal OUT is connected to GND. On the other hand, because all the input terminals INA to IND are at the H level, all the Pch transistors QP51 to QP54 have been turned off, and the source voltage Vdd is not connected to the output terminal OUT.

Accordingly, when all the input terminals INA, INB, INC, and IND are set to the H level, the output terminal OUT outputs a signal at the L level.

Next, the operation of this conventional art will be explained with reference to the operation timing chart of FIG. 6. Before the point of time t61, because the input terminal INA is at the L level and INB to IND are at the H level, the output terminal OUT is at the H level.

At the point of time t61, when the input terminal INA is inverted from the L level to the H level while maintaining the input terminals INB to IND at the H level, that is, when all the input terminals INA to IND are set to the H level, the output terminal OUT varies from the H level to the L level in the period tpdA between t61 and t62.

At the point of time t63, when the input terminal IND is inverted from the H level to the L level while maintaining the input terminals INA to INC at the H level, the output terminal OUT varies from the L level to the H level in the period tpdD between t63 and t64.

At the point of time t65, when the input terminal IND is inverted from the L level to the H level while maintaining the input terminals INA to INC at the H level, the output terminal OUT varies from the H level to the L level in the period tpdD between t65 and t66.

As another conventional technique, a five-input NAND circuit shown in the circuit diagram of FIG. 7 is known. In this circuit, each of the transistor arrays TA1 to TA4 comprises five Nch transistors connected in a line. The gates of the five Nch transistors are connected to input terminals INA to INE, respectively.

FIG. 10 shows the layout of the circuit on an IC. On the IC, the transistor arrays TA1 to TA4 are aligned in a line.

In the transistor array TA1, the Nch transistors are arranged in the order of QN1, QN2, QN3, Qn4, and Qn5 from the left of FIG. 10. In the transistor array TA2, the Nch transistors are arranged in the order of QN10, QN9, QN8, Qn7, and Qn6 from the left of FIG. 10. In the transistor array TA3, the Nch transistors are arranged in the order of QN11, QN12, QN13, Qn14, and Qn15 from the left of FIG. 10. In the transistor array TA4, the Nch transistors are arranged in the order of QN20, QN19, QN18, Qn17, and Qn16 from the left of FIG. 10. That is, the QN1 to QN20 are aligned in a line. The transistor arrays TA1 to TA4 are formed in separated well areas.

In the transistor array TA1, the source area of the transistor QN5 is connected via an aluminum first-layer connection to a GND aluminum first-layer connection. The drain area of the QN5 is in the same diffusion area as the source area of the QN4 adjacent to the QN5. The drain area of QN4 is in the same diffusion area as the source area of the QN3 adjacent to the QN4. The drain area of the QN3 is connected to the source area of the next QN2 via two parallel aluminum first-layer connections.

The drain area of the QN2 is in the same diffusion area as the source area of the adjacent QN1. The drain area of the QN1 is connected to the output terminal OUT via the aluminum first-layer connection.

The drain area of the QN6 in the transistor array TA2 is connected to the drain area of the QN11 in the adjacent transistor array TA3 by two aluminum first-layer connections. Further, these connections are connected to the output terminal OUT by an aluminum first-layer connection.

In the transistor array TA2, the source area of the QN6 is in the same diffusion area as the drain area of the adjacent QN7. The source area of the QN7 is in the same diffusion area as the drain area of the adjacent QN8. The source area of the QN8 is connected to the drain area of the adjacent QN9 via two aluminum first-layer connections. The source area of the QN9 is in the same diffusion area as the drain area of the adjacent QN10. The source area of the QN10 is connected to the GND aluminum first-layer connection via an aluminum first-layer connection.

The arrangement in the transistor array TA3 is similar to that in the transistor array TA1, and the arrangement in the transistor array TA4 is similar to that in the transistor array TA2.

FIG. 11 is the timing chart showing the operation of the above-mentioned circuit. When at the point of time t51 the input terminal INE is inverted from the H level to the L level, the output terminal OUT varies from the L level to the H level between t51 and t52. When at the point of time t53 the input terminal INE is inverted from the L level to the H level, the output terminal OUT varies from the H level to the L level between t53 and t54.

In the conventional four-input NAND circuit which comprises CMOSs shown in FIG. 5, when only the input terminal INA is set to the L level and the other INB to IND are set to the H level, only the Pch transistor QP51 is turned on, and the other QP52 to QP54 are turned off. Further, the Nch transistors QN51, QN55, and QN59 are turned off, and the other QN52 to QN54, QN56 to QN58, and QN5A to QN5C are turned on.

Because the Pch transistor QP51 has been turned on, the output terminal OUT is at the H level. All the areas connected to the output terminal OUT are at the H level. These areas are full of positive electric charge. Specifically, the areas to the output terminal OUT are the connection portions of the sources and drains of the Pch transistors QP51 to QP54, and the connected portions of the drains of the Nch transistors QN51, QN55, and QN59. Positive electric charge is filled to the junction capacities of these connected portions.

When, while setting the input terminals INB to IND at the H level, only the input terminal INA is inverted from the L level to the H level, the Pch transistors QP51 is turned off, and the Nch transistors QN51, QN55, and QN59 are turned on, so that the output terminal OUT is changed from the H level to the L level.

At that time, the positive electric charge, which has been stored to the junction capacities at the drains of QN51, QN55 and QN59 and at the drains of QP51, QP52, QP53, and QP54, is discharged. The amount of discharge is in proportion to the total junction capacities. When the electric charge stored atone of terminals of the transistor, that is, the drain or the source, is 0.5, the electric discharge caused by changing the input terminal INA from the L level to the H level becomes 0.5×(3+4)=3.5.

The time tpdA required to invert the output terminal OUT from the H level to the L level, that is, the output level changing time is in proportion to the electric discharge of 3.5.

On the other hand, when the input terminals INA to INC are set to the H level and only IND is set to the L level, only the Pch transistor QP54 is turned on, and the other QP51 to QP53 are turned off. Further, the Nch transistors QN54, QN58, and QN5C are turned off, and the QN51 to QN53, QN55 to Qn57, and QN59 to QN5B are turned on.

In this situation, the output terminal OUT is set to the H level by the Pch transistor QP54. All the areas connected to the output terminal OUT are at the H level. These areas are full of positive electric charge. Specifically, the areas to the output terminal OUT are the connection portions of the sources and drains of the Pch transistors QP51 to QP54, and the connected portions of the drains and sources of the Nch transistors QN51 to QN53, QN55 to QN57, and QN59 to QN5B, and the connected portions of the drains of the QN54, QN58, and QN5C. Positive electric charge is applied to the junction capacities of these connected portions.

When, while setting the input terminals INA to INC at the H level, only the input terminal IND is inverted from the L level to the H level, the Pch transistors QP54 is turned off, and the Nch transistors QN54, QN58, and QN5C are turned on, so that the output terminal OUT is inverted from the H level to the L level.

At that time, the positive electric charge, which has been stored to the junction capacities at the drains and sources of QN51 to QN53, QN55 to QN57, and QN59 to QN5B, at the drains of the QN54, QN58, and QN5C, and at the drains of the QP51, QP52, QP53, and QP54, which are connected to the output terminal OUT, is discharged. In a manner similar to the fore-mentioned case, when the electric charge stored at one of terminals of the transistor is 0.5, the electric discharge becomes 0.5×2×3×3+0.5×(3+4)=12.5.

The output level changing time tpdD of the output terminal OUT is in proportion to the electric discharge of 12.5.

That is, when the output terminal OUT is inverted from the H level to the L level, the electric charge and discharge differ from each other between the case in which the level of the input terminal connected to the transistor close to the output terminal OUT, e.g., INA is changed, and the case in which the level of the input terminal connected to the transistor close to the GND, e.g., IND is changed. Therefore, there is the problem that the output level changing times tpd at the output terminal OUT significantly differ.

In the example shown in FIG. 6, the output level changing time tpdD (from t63 to t64, and from t65 to t66) when the level of the input terminal IND is changed is approximately twice the output level changing time tpdA (from t61 to t62) when the level of the input terminal INA is changed.

In the five-input NAND circuit shown in FIG. 7, when, maintaining the INA to IND at the H level, only the INE is inverted from the L level to the H level, the electric charge, which is stored at the drains and sources of the Nch transistors QN1 to QN4, QN6 to QN9, QN11 to QN14, and QN16 to QN19 connected in lines and the drains of the QN5, QN10, QN15, and QN20, must be discharged. Further, the electric charge which is stored at the drains of the Pch transistors QP1 to QP5 must be discharged.

When the junction capacity of one of the terminals of the transistor, that is, the drain or the source, is 0.5, the junction capacity of the Nch transistors is 18, the junction capacity of the Pch transistor is 2.5, and the total of the junction capacities is 20.5, which correspond to 72 fF.

To the above-mentioned junction capacity, the capacity of 80fF of the aluminum first-layer connection with the length of 400 im, which is shown in FIG. 10, is added, and the total capacity is 152 fF.

Accordingly, when only the input terminal INE is inverted from the L level to the H level, the electric charge, stored to the total capacity of 152 fF, must be completely discharged. As shown in the timing chart of FIG. 11, there is the problem that the time tpd required to change the level at the output terminal OUT, depending on the level at the input terminal INE, is lengthened from t51 to t52 and from t53 to t54.

BRIEF SUMMARY OF THE INVENTION

It is therefore an object of the present invention to provide a logic product circuit that prevents the output level changing time from being lengthened, even when the level at any of input terminals is changed.

In a first aspect of the present invention, the logic product circuit comprises: a plurality of transistors arranged in a matrix; a plurality of input terminals; and a single output terminal. The transistors in each column are connected in a line, forming a transistor array, the transistor arrays are connected in parallel between the output terminal and the ground, each of the input terminals is connected to the inputs to the transistors in all the columns, and the transistors to which each input terminal is connected are arranged in different rows.

In the first aspect of the present invention, the numbers of the transistors in the respective rows are the same. The transistors are MOSFETs, or junction field effect transistors.

In a second aspect of the present invention, the logic product circuit comprises: a plurality of transistors arranged in a matrix; a plurality of input terminals; a single output transistor; and a single output terminal connected to the output transistor. The transistors in each column are connected in a line, forming a transistor array; the transistor arrays are connected in parallel so that the transistors form rows, one of the rows of the transistors is connected between the input to the output transistor and the ground, the other row of the transistors is connected between the output terminal and the ground, the input terminals are connected to the input to the transistors in all the columns; and the transistors to which each input terminal is connected are arranged in different rows.

In the second aspect of the present invention, the numbers of the transistors in the respective rows is the same. The transistors are MOSFETs, or junction field effect transistors. The output transistor is a bipolar transistor.

In a third aspect of the present invention, the logic product circuit comprises: a plurality of transistors arranged in a matrix; a plurality of input terminals; and a single output transistor, a single output terminal. The transistors in each column are connected in a line, forming a transistor array; the transistor arrays are connected in parallel between the output terminal and the ground; each of the input terminals is connected to the transistors in all the columns; and the transistors forming the transistor arrays neighbor each other on an IC.

In the third aspect of the present invention, the transistors forming the transistor array are N-channel MOS transistors. All the transistors in the transistor arrays are arranged in a single line on the IC, a connection from the output terminal is provided in the middle of the line of the transistors, and the terminals at the both ends of the line of the transistors are connected to the ground. Some of the neighboring transistors in the transistor arrays on the IC are connected without an aluminum connection. Further, some of the sources and drains of the transistors on the IC are within the same diffusion areas.

According to the present invention, when the level of one of the input terminals is changed, the junction capacities of the transistors are set so that the electric charge or discharge is made regular, decreasing a variation in the output level changing time.

Because the electric charge or discharge is made regular, the electric charge can be decreased, thereby shortening the output level changing time and accelerating switching of the outputs, as compared with the conventional technique.

Further, according to the IC layout of the present invention, when changing the output level, the electric charge or discharge can be decreased, thereby shortening the output level changing time and accelerating switching of the outputs.

DETAILED DESCRIPTION OF THE INVENTION

Figure 1:
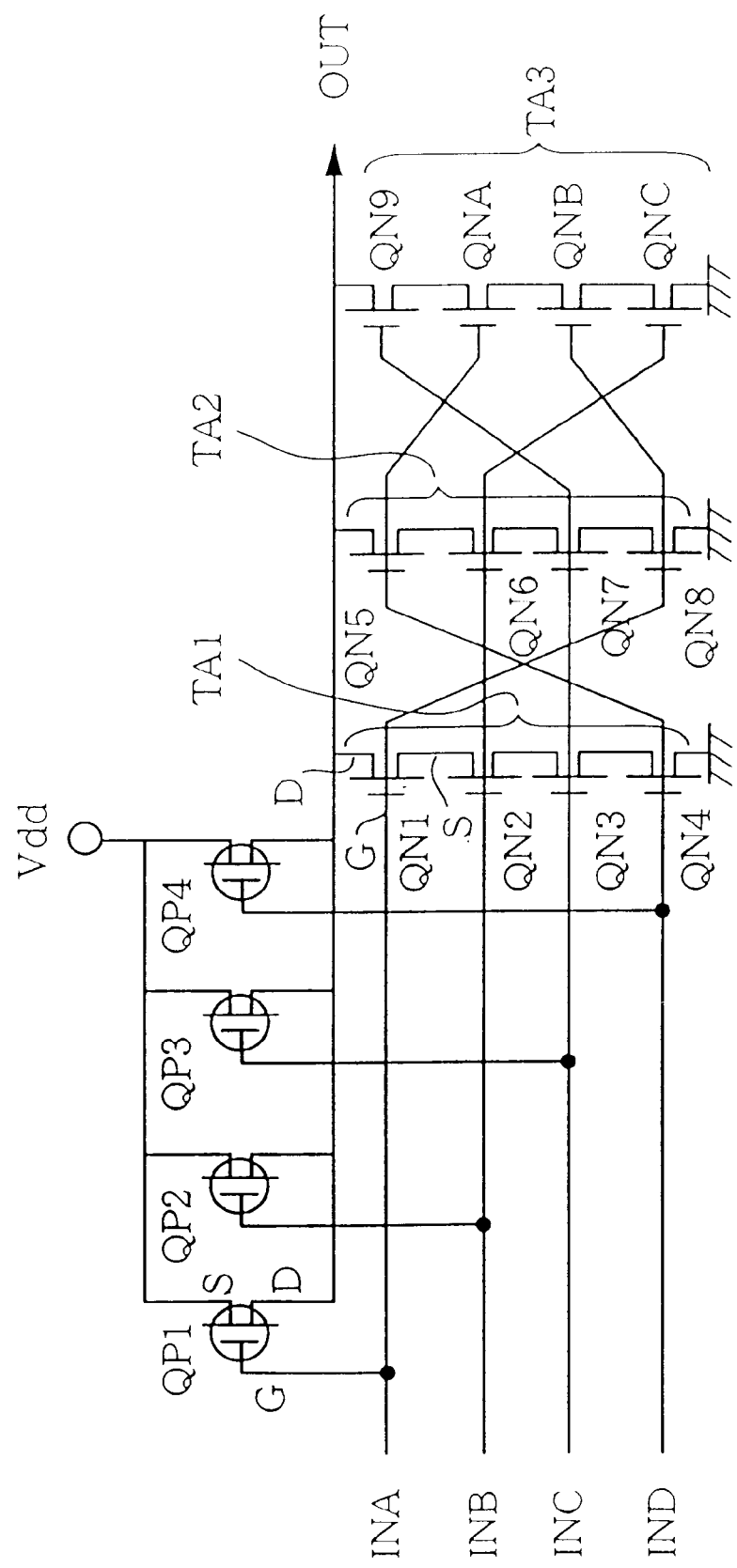
FIG. 1 is a circuit diagram showing the CMOS four-input NAND circuit of the first embodiment of the present invention.

The first embodiment of the present invention will be explained. FIG. 1 shows a four-input NAND circuit. INA, INB, INC, and IND are input terminals to the four-input NAND circuit, and OUT is an output terminal from the four-input NAND circuit. QP1, QP2, QP3, and QP4 are P-channel transistors (hereinafter referred to as Pch transistors), and QN1, QN2, ..., Q9, QNA, QNB, and QNC are N-channel transistors (hereinafter referred to as Nch transistors). The transistors are MOSFETs, or junction field effect transistors.

The Pch transistors QP1 to QP4 are connected between a power source voltage Vdd and an output terminal OUT in a parallel manner. That is, the sources of QP1 to QP4 are connected to the power source voltage Vdd, and the drains of QP1 to QP4 are connected to the output terminal OUT.

The Nch transistors QN1 to QN4 are successively connected in a line, forming a transistor array TA1. In the transistor array TA1, the source of QN1 is connected to the drain of QN2, the source of QN2 is connected to the drain of QN3, and the source of QN3 is connected to the drain of QN4.

One end of the transistor array TA1 is connected to the output terminal OUT, and the other terminal is connected to GND. That is, the drain of QN1 is connected to the output terminal OUT, and the source of QN4 is connected to GND.

Similarly, the Nch transistors QN5 to QN8 are successively connected in a line, forming a transistor array TA2. In the transistor array TA2, the source of QN5 is connected to the drain of QN6, the source of QN6 is connected to the drain of QN7, and the source of QN7 is connected to the drain of QN8.

One end of the transistor array TA2, that is, the drain of the QN5, is connected to the output terminal OUT, and the other terminal, that is, the source of the QN8, is connected to GND.

Similarly, the Nch transistors QN9 to QNC are successively connected in a line, forming a transistor array TA3. In the transistor array TA3, the source of QN9 is connected to the drain of QNA, the source of QNA is connected to the drain of QNB, and the source of QNB is connected to the drain of QNC.

One end of the transistor array TA3, that is, the drain of QN9, is connected to the output terminal OUT, and the other terminal, that is, the source of the QNC, is connected to GND.

The input terminal INA is connected to the gate of the Pch transistor QP1 and to the gates of the Nch transistors QN1, QN8, and QNB. The input terminal INB is connected to the gate of the Pch transistor QP2 and to the gates of the Nch transistors QN2, QN6, and QNC. The input terminal INC is connected to the gate of the Pch transistor QP3 and to the gates of the Nch transistors QN3, QN7, and QN9. The input terminal IND is connected to the gate of the Pch transistor QP4 and to the gates of the Nch transistors QN4, QN5, and QNA.

Each of the input terminals is connected to one of the transistors in each transistor array, that is, to in total three transistors.

In each transistor array hereinafter, the transistor closest to the output terminal OUT is referred to as a first transistor, the second closest transistor is referred to as a second transistor, the third closest transistor is referred to as a third transistor, and the transistor farthest from the output terminal OUT is referred to as a fourth transistor.

Since the input terminal INA is connected to the QN1, QN8, and QNB, the INA is connected to the first, fourth, and third transistors. Since the input terminal INB is connected to the QN2, QN6, and QNC, the INB is connected to the second, second, and fourth transistors. Since the input terminal INC is connected to the QN3, QN7, and QN9, the INC is connected to the third, third, and first transistors. Since the input terminal IND is connected to the QN4, QN5, and QNA, the IND is connected to the fourth, first, and second transistors.

In the Pch transistors, when the input terminal INA is set to the L level, the QP1 is turned on and becomes conductive, so that the source voltage Vdd is output from the output terminal OUT. When the input terminal INB, INC, or IND is set to the L level, the QP2, QP3, or QP4 is turned on and becomes conductive, so that the source voltage Vdd is output from the output terminal OUT.

That is, when at least one of the input terminals INA, INB, INC, and IND is set to the L level, the output terminal OUT outputs a signal at the H level.

In the Nch transistors, when the input terminal INA is set to the L level and the input terminals INB, INC, and IND are set to the H level, the QN1, QN8, and QNB connected to the input terminal INA are turned off, and the QN2, QN6, and QNC connected to the input terminal INB, the QN3, QN7, and QN9 connected to the input terminal INC, and the QN4, QN5, and QNA connected to the input terminal IND are turned on.

In this situation, because the transistor array TA1 includes the N-ch transistor QN1 which has been turned off, the entire transistor array TA1 has been turned off. Similarly, because the transistor array TA2 includes the Nch transistor QN8 which has been turned off, the entire transistor array TA2 has been turned off. Similarly, because the transistor array TA3 includes the Nch transistor QNB which has been turned off, the entire transistor array TA3 has been turned off.

Thus, the transistor arrays TA1, TA2, and TA3 which are provided in parallel between the output terminal OUT and GND have been turned off, and the output terminal OUT is not connected to GND. Because the input terminal INA is at the L level, the Pch transistor QP1 has been turned on so that the source voltage Vdd is connected to the output terminal OUT.

Thus, when the input terminal INA is at the L level and the input terminals INB, INC, and IND are at the H level, the output terminal OUT outputs a signal at the H level.

When all the input terminals INA, INB, INC, and IND are set to the H level, all the Nch transistors QN1 to QNC have been turned on. That is, all the transistor arrays TA1, TA2, and TA3 become conductive so that the output terminal OUT is connected to GND. Because all the input terminals INA to IND are at the H level, the Pch transistors QP1 to QP4 have been turned off so that the source voltage Vdd is not connected to the output terminal OUT.

Thus, when all the input terminals INA, INB, INC, and IND are set to the H level, the output terminal OUT outputs the signal at the L level.

Figure 2:
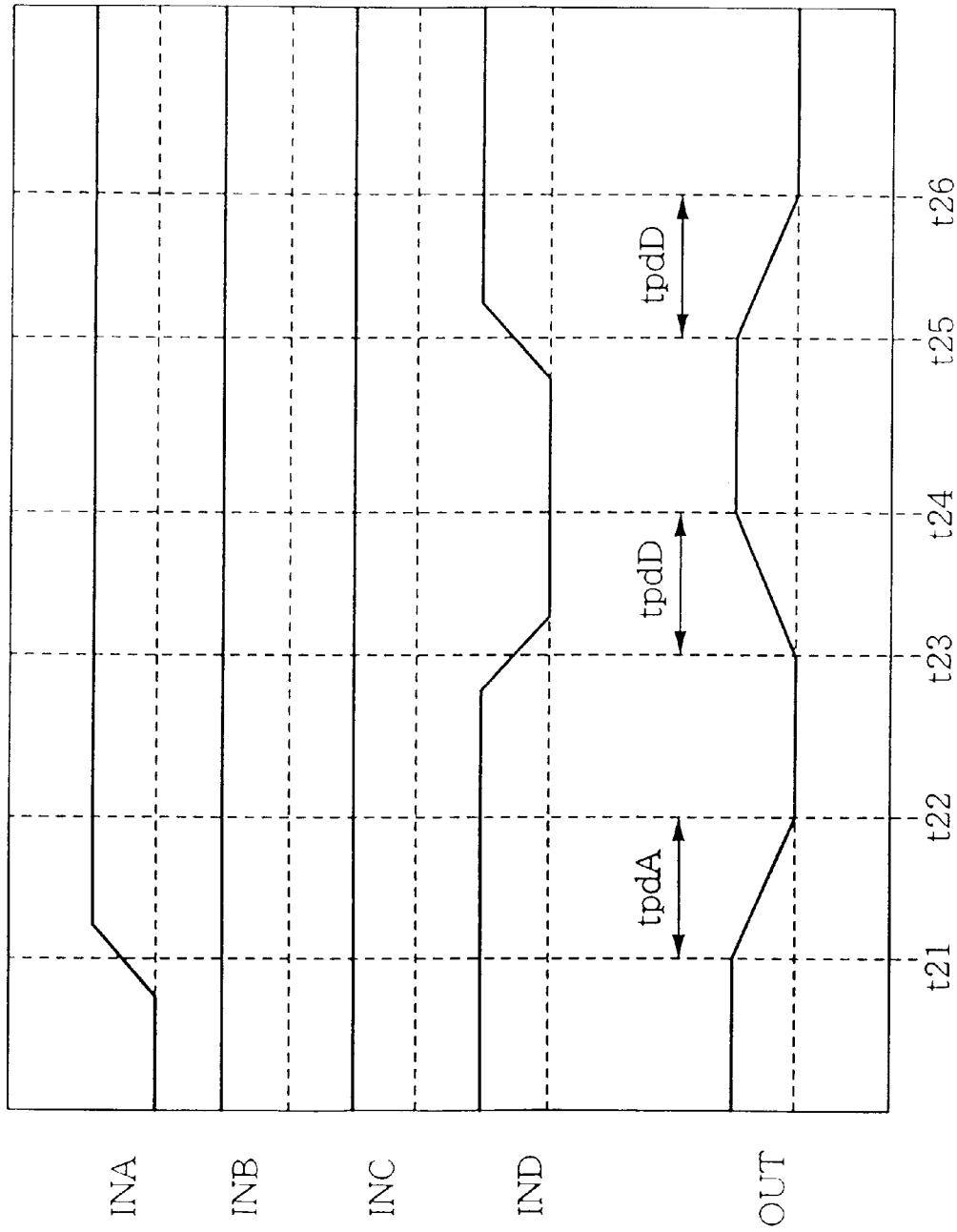
FIG. 2 is a timing chart showing the operation of the CMOS four-input NAND circuit of the first embodiment of the present invention.

The operation of the embodiment will be explained with reference to the timing chart of FIG. 2. Before the point of time t21, a signal at the L level is input to the input terminal INA, and signals at the H level are input to the input terminal INB, INC, and IND. Accordingly, the output terminal OUT outputs the signal at the H level.

At the point of time t21, when the input terminal INA is changed from the L level to the H level while maintaining the input terminals INB to IND at the H level, the output terminal OUT is changed from the H level to the L level between the time of period tpdA from t21 to t22.

At the point of time t23, when the input terminal IND is inverted from the H level to the L level while maintaining the input terminals INA to INC at the H level, the output terminal OUT is changed from the L level to the H level between the time of period tpdD from t23 to t24.

At the point of time t25, when the input terminal IND is inverted from the L level to the H level while maintaining the input terminals INA to INC at the H level, the output terminal OUT is changed from the H level to the L level between the time of period tpdD from t25 to t26.

The output level inversion time of the output terminal OUT when the level at the input terminal INA is inverted, that is, the time of period tpdA between t21 and t22 is identical to those of the output terminal OUT when the level at the input terminal IND is inverted, that is, the time of period tpdD from t23 to t24 and the time of period tpdD from t25 to t26.

The electric charge or discharge, when the level of the output terminal is changed as the level of the input terminal INA is changed, is almost the same as that when the level of the output terminal is changed as the level of the input terminal IND.

When only the input terminal INA is at the L level and the INB to IND is at the H level, only the Pch transistor QP1 has been turned on, and the QP2 to QP4 have been turned off. Further, the Nch transistor QN, QN8, and QNB have been turned off, and the other transistors QN2 to QN4, QN5 to QN7, QN9, QNA, and QNC have been turned on.

In this situation, because the Pch transistor QP1 has been turned on, the output terminal is set at the H level. Accordingly, all the areas connected to the output terminal OUT are set at the H level. In other words, the areas are full of positive charge. Specifically, the positive charge is applied to the junction capacities at the connected portions of the sources and drains of the Pch transistors QP1 to QP4, the connected portions of the drains of the Nch transistors QN1, QN8, and QNB, and the connected portions of drains and sources of the Nch transistors QN5 to QN7, QN9, and QNA.

When the input terminals INB to IND are at the H level, only the input terminal INA is changed from the L level to the H level, the Pch transistor QP1 is turned off, the Nch transistors QN1, QN8, and QNB are turned on, and the output terminal OUT is accordingly inverted from the H level to the L level.

At that time, the electric charges stored to the junction capacities at the drains of QN1, QN8, and QNB, the drains and sources of QN5 to QN7, QN9, QNA, and the drains of QP1, QP2, QP3, and QP4, which were connected to the output terminal OUT, are discharged. The amount of discharge is in proportion to the junction capacities. When the electric charge stored at one of the terminals of the transistor, that is, the drain or source is 0.5, the electric discharge caused by changing only the input terminal INA from the L level to the H level is 0.5×3+0.5×2×5+0.5×4=8.5.

The time tpdA required to change the output terminal OUT from the H level to the L level, which is the output level changing time, is in proportion to the electric discharge of 8.5.

On the other hand, when the input terminals INA to INC are at the H level and only IND is at the L level, only the Pch transistor QP4 has been turned on, and the other QP1 to QP3 have been turned off. The Nch transistors QN4, QN5, and QNA have been turned off, and the other QN1 to QN3, QN6 to QN8, QN9, QNB, and QNC have been turned on.

In this situation, the output terminal is set at the H level by the Pch transistor QP4, which has been turned on. Accordingly, all the areas which are connected to the output terminal OUT are at the H level. These areas are full of positive electric charge. Specifically, the areas connected to the output terminal OUT are the connection portions of the sources and drains of the Pch transistors QP1 to QP4, and the connected portions of the drains and sources of the Nch transistors QN1 to QN3 and QN9, and the connected portions of the drains of QN4, QN5, and QNA. Positive electric charge is filled to the junction capacities of these connected portions.

In this situation, that is, when the input terminals INA to INC are at the H level, only the input terminal IND is changed from the L level to the H level, the Pch transistor QP4 is turned off, Nch transistors QN4, QN5, and QNA are turned on, and the output terminal OUT is accordingly changed from the H level to the L level.

At that time, the electric charge stored to the junction capacities at the drains and sources of QN1 to QN3, and QN9, the drains of QN4, QN5, and QNA, and the drains of QP1, QP2, QP3, and QP4, which were connected to the output terminal OUT, are discharged. When the electric charge stored at one of the terminals of the transistor is 0.5, the electric discharge is 0.5×2×4+0.5×3+0.5×4=7.5.

The output level changing time tpdD of the output terminal OUT is in proportion to the electric discharge of 7.5.

When the output terminal OUT is changed from the H level to the L level, the electric discharge caused by changing the input terminal INA is almost the same as that by changing the input terminal IND. Accordingly, the output level changing times tpd of the output terminal OUT are also the same.

The reason for this is that the electric charge or discharge of 6.5 stored in the areas between the Nch transistors QN1, QN8, and QNB, whose gates are connected to the input terminal INA, and the output terminal OUT is almost the same as the electric charge or discharge of 5.5 stored in the areas between the Nch transistors QN4, QN5, and QNA, whose gates are connected to the input terminal IND and the output terminal OUT.

This is the same in the input terminals INB and INC. The input terminal INB is connected to the gates of the Nch transistors QN2, QN6, and QNC, and the electric charge or discharge stored in the areas between these Nch transistors and the output terminal OUT is 6.5. The input terminal INC is connected to the gates of the Nch transistors QN3, QN7, and QN9, and the electric charge or discharge stored in the areas between these Nch transistors and the output terminal OUT is 5.5.

That is, whichever level of the input terminal INA, INB, INC, or IND is changed, the electric charge or discharge as the output level of the output terminal OUT varies is almost the same.

Figure 3:
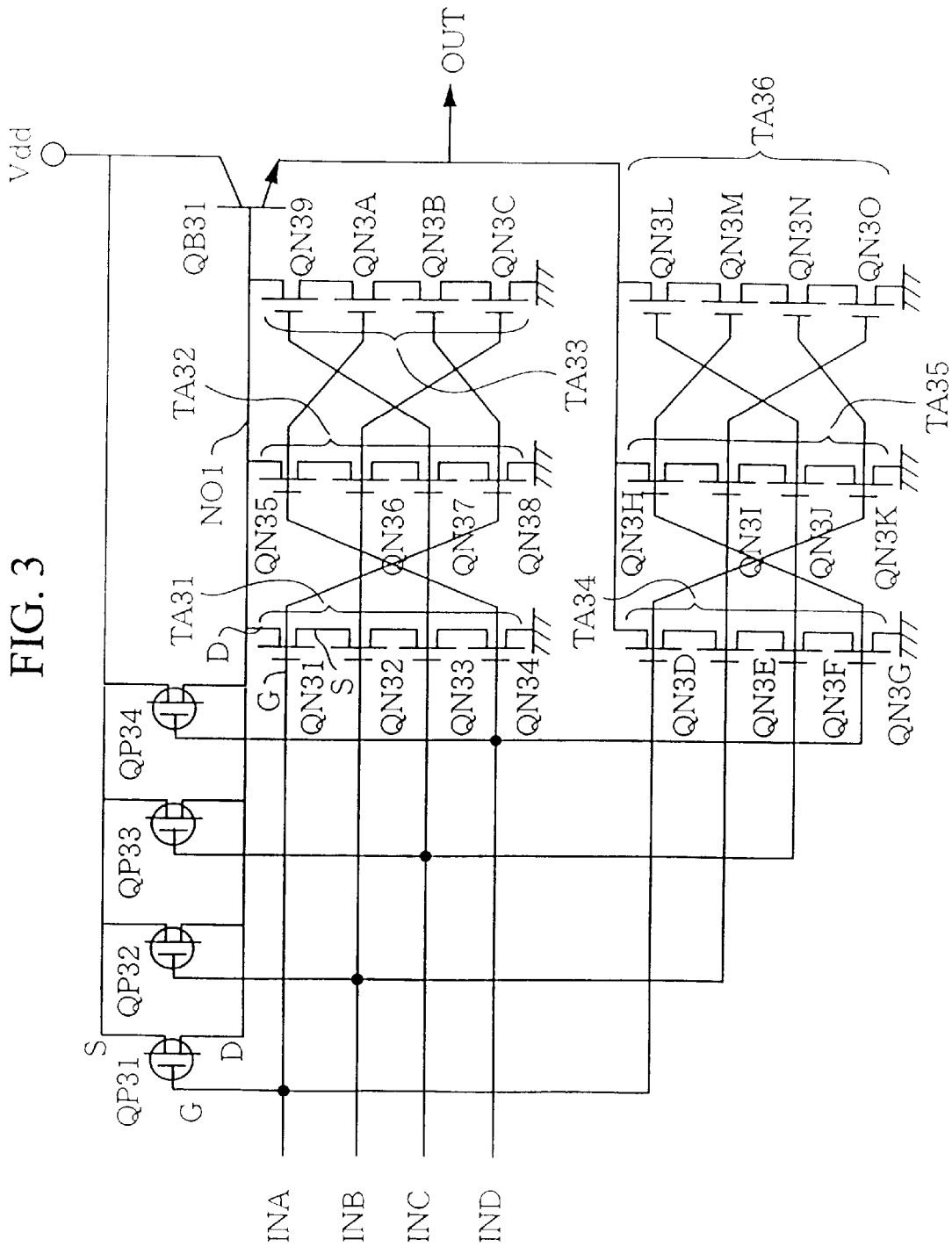
FIG. 3 is a circuit diagram showing the Bi-CMOS four-input NAND circuit of the second embodiment of the present invention.

The second embodiment of the present invention will be explained with reference to FIG. 3. The second embodiment is a four-input NAND circuit using Bi-CMOS. INA to IND are input terminals to the four-input NAND circuit, and OUT is an output terminal from the four-input NAND circuit. QP31 to QP34 are Pch transistors, and QN31, QN32, . . . QN3M, QN3N, and QN3O are Nch transistors. Further, an output bipolar transistor QB31 is provided.

The Pch transistors QP31 to QP34 are connected in a parallel manner between the power source voltage Vdd and the output terminal OUT. The sources of QP31 to QP34 are connected to the source voltage Vdd, die drains of QP31 to QP34 are connected to a connected portion NO1, that is, the base of the output bipolar transistor Q31.

In a manner similar to the first embodiment, the Nch transistors QN31, QN32, QN33, and QN34 form a transistor array TA31, the Nch transistors QN35, QN36, QN37, and QN38 form a transistor array TA32, and the Nch transistors QN39, QN3A, QN3B, and QN3C form a transistor array TA33.

In the transistor array TA31, the source of QN31 is connected to the drain of QN32, the source of QN32 is connected to the drain of QN33, and the source of QN33 is connected to the drain of QN34. The transistor arrays TA32, and TA33 have a similar structure.

The transistor arrays TA31, TA32, and TA33 are connected in parallel to each other between the connection portion NO1, which is connected to the base of the output bipolar transistor QB31, and GND.

One of terminals of the transistor array TA31 is connected to the connection portion NO1, and the other terminal is connected to GND. That is, the drain of QN31 is connected to the connection portion NO1, and the source of QN34 is connected to GND. The transistor arrays TA32 and TA33 have a similar structure.

The connections of the input terminals INA, INB, INC, and IND with the gates of the Pch transistors QP31 to QP34 and the gates of the Nch transistors QN31 to QN3C are similar to those of the first embodiment.

The Nch transistors QN3D, QN3E, QN3F, and QN3G form a transistor array TA34, the Nch transistors QN3H, QN3I, QN3J, and QN3K form a transistor array TA35, and the Nch transistors QN3L, QN3M, QN3N, and QN3Q form a transistor array TA36.

In the transistor array TA34, the source of QN3D is connected to the drain of QN3E, the source of QN3E is connected to the drain of QN3F, and the source of QN3F is connected to the drain of QN3G. The transistor arrays TA35, and TA36 have a similar structure.

The transistor arrays TA34, TA35, and TA36 are connected in parallel to each other between the output terminal OUT and GND.

One of terminals of the transistor array TA34 is connected to the output terminal OUT, and the other terminal is connected to GND. That is, the drain of QN3D is connected to the output terminal OUT, and the source of QN3G is connected to GND. The transistor arrays TA35 and TA36 have a similar structure.

The connections of the input terminals INA, INB, INC, and IND to the gates of the Nch transistors QN3D to QN30 are similar to the connections of the gates of the Nch transistors QN31 to QN3C.

The collector of the output bipolar transistor QB31 is connected to the source voltage VDD, its base is connected to the connection portion NO1, and its emitter is connected to the output terminal OUT.

When the input terminal INA is set to the L level, the Pch transistor QP31 is turned on and becomes conductive, so that the source voltage VDD is applied to the connection portion, that is, the base of the output bipolar transistor, and QB31 is turned on. As QB31 has been turned on, the source voltage Vdd is output through the collector and emitter of QB31 from the output terminal OUT. Thus, the output terminal OUT is changed to the H level.

Similarly, when the input terminal INB, INC, or IND is set to the L level, QP32, QP33, or QP34 is turned on and becomes conductive, so that the source voltage Vdd is output from the output terminal OUT. Thus, the output terminal OUT is changed to the H level.

That is, when at least one of input terminals INA, INB, INC, and IND is set to the L level, the output terminal OUT outputs a signal at the H level.

When the input terminal INA is set to the L level and the input terminals INB, INC, and IND are set to the H level, the Nch transistors QN31, Qn38, QN3B, Qn3D, QN3K, and QN3N which are connected to the input terminal INA are turned off, and the other Nch transistors are turned on.

In this situation, the transistor arrays TA31 to TA36 have been turned off. Therefore, the connection portion NO1 is not connected to GND, and the output terminal OUT is not connected to GND. On the other hand, since the input terminal INA is at the L level, the Pch transistor QP31 has been turned on, QB31 has been turned on, and accordingly the source voltage Vdd is connected to the output terminal OUT. Thus, the output terminal OUT is at the H level.

Thus, when the input terminal INA is set to the L level and the input terminals INB, INC, and IND are set to the H level, the output terminal OUT outputs the signal at the H level.

Further, when all the input terminals INA, INB, INC, and IND are set to the H level, all the Nch transistors QN31 to QN30 are turned on, and all the transistor arrays TA31 to TA36 become conductive.

By making the transistor arrays TA31 to TA3 conductive, the connection portion NO1, that is, the base of the output bipolar transistor QB31, is connected to GND, and this QB31 is turned off. On the other hand, since all the input terminals INA to IND are at the H level, all the Pch transistors QP31 to QP34 have been turned off, and therefore the source voltage Vdd is not connected to the connection portion NO1. Further, since the transistor arrays TA34 to TA36 have been conductive, the output terminal OUT is connected to GND, and thus the output terminal OUT is at the L level.

Accordingly, when all the input terminals INA, INB, INC, and IND are set to the H level, the output terminal OUT outputs the signal at the L level.

Figure 4:
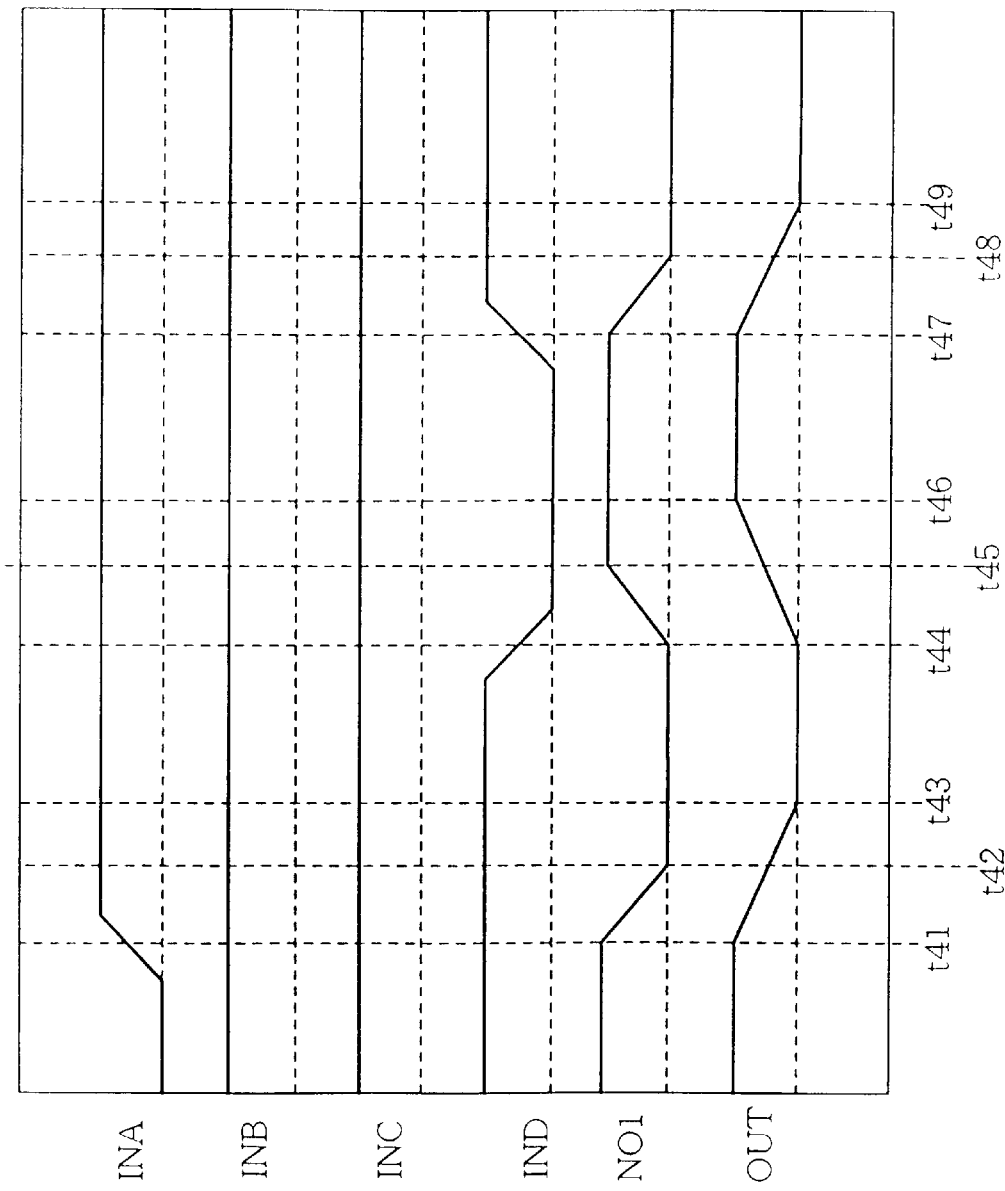
FIG. 4 is a timing chart showing the operation of the Bi-CMOS four-input NAND circuit of the second embodiment of the present invention.
Figure 5:
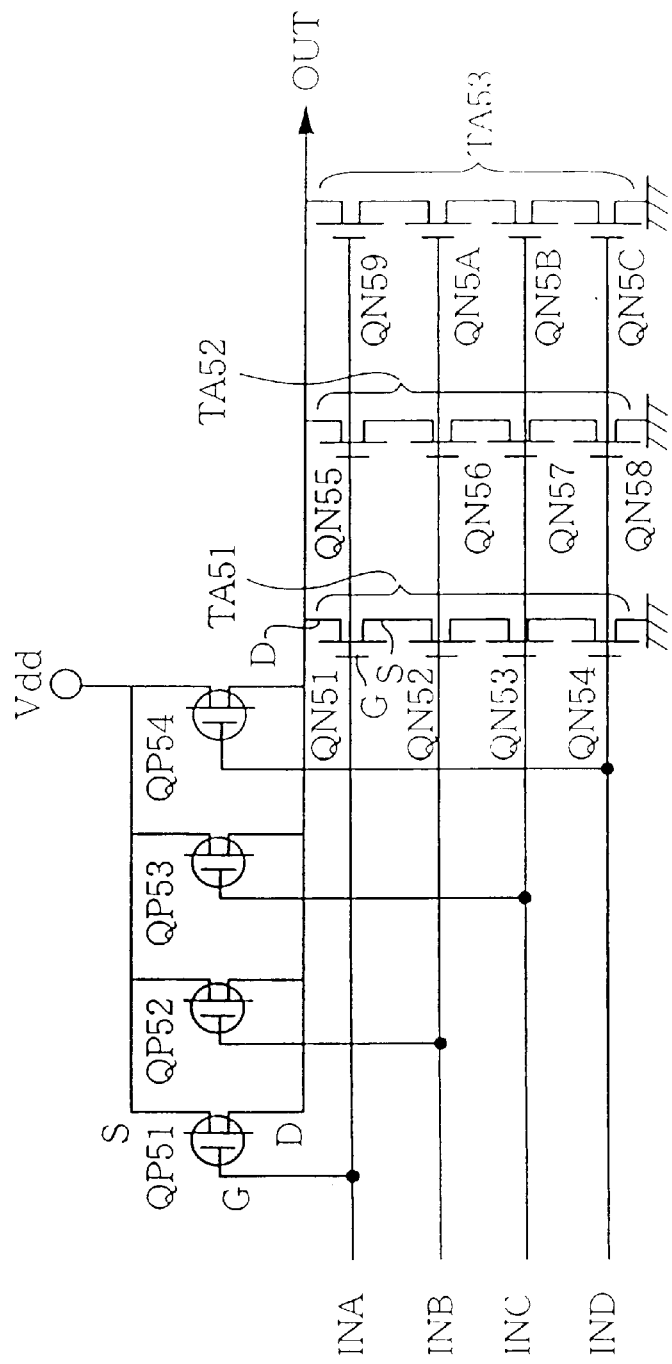
FIG. 5 is a circuit diagram showing the CMOS four-input NAND circuit of the conventional technique.
Figure 6:
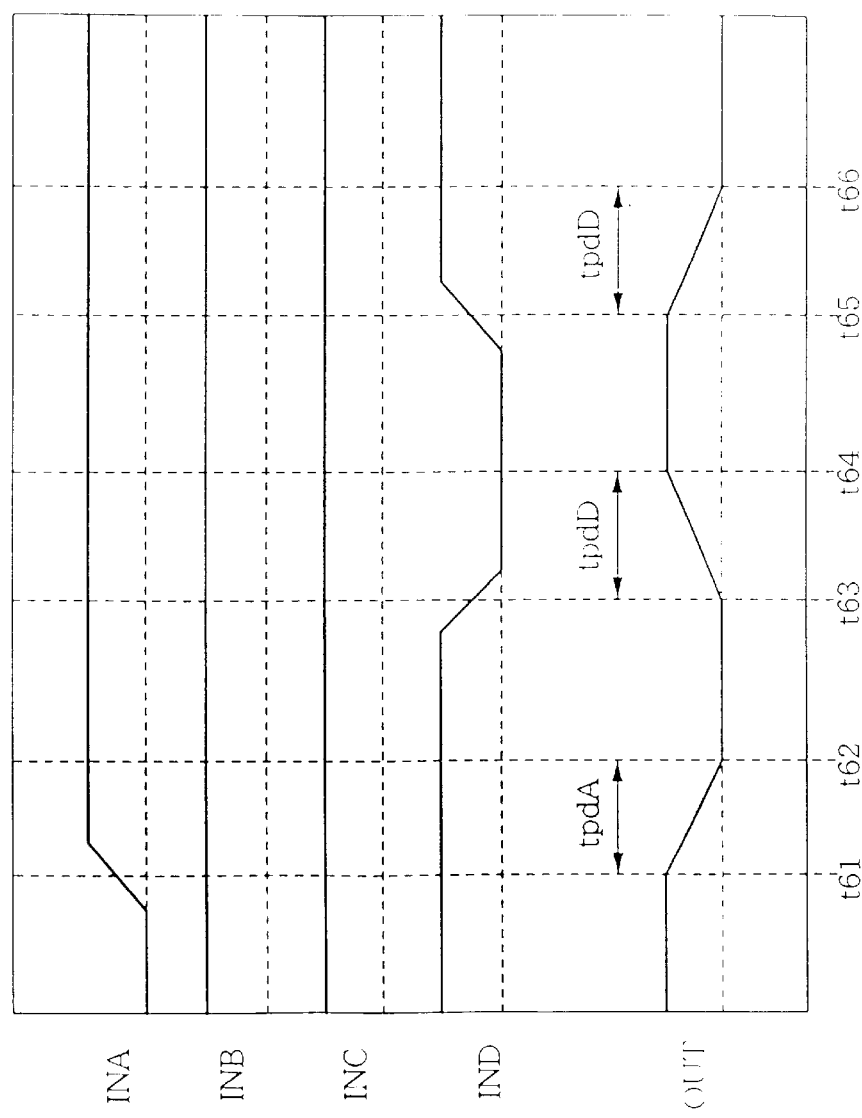
FIG. 6 is a timing chart showing the operation of the CMOS four-input NAND circuit of the conventional technique.

Next, the operation of the embodiment will be explained with reference to the timing chart of FIG. 4. At the point of time t41, when the input terminal INA is inverted from the L level to the H level while maintaining the input terminals INB to IND at the H level, the connection portion NO1 is inverted from the H level to the L level from t41 to t42, and accordingly the output terminal OUT is inverted from the H level to the L level from t41 to t43.

Then, at the point of time t44, when the input terminal IND is inverted from the H level to the L level while maintaining the input terminals INA to INC at the H level, the connection portion NO1 is inverted from the L level to the H level from t44 to t45, and the output terminal OUT is changed from the L level to the H level from t44 to t46.

At the point of timet47, when the input terminal IND is inverted from the L to the H level while maintaining the input terminals INA to INC at the H level, the connection portion NO1 is changed from the H level to the L level from t47 to t48, and the output terminal OUT is changed from the H level to the L level from t47 to t49.

In this embodiment, whichever the input level to the input terminals INA, INB, INC, and IND is changed, the electric charge or discharge caused by changing the levels of the connection portion NO1 and the output terminal OUT is almost the same, according to the connections between the respective input terminals and the gate terminals of the Nch transistors.

Figure 7:
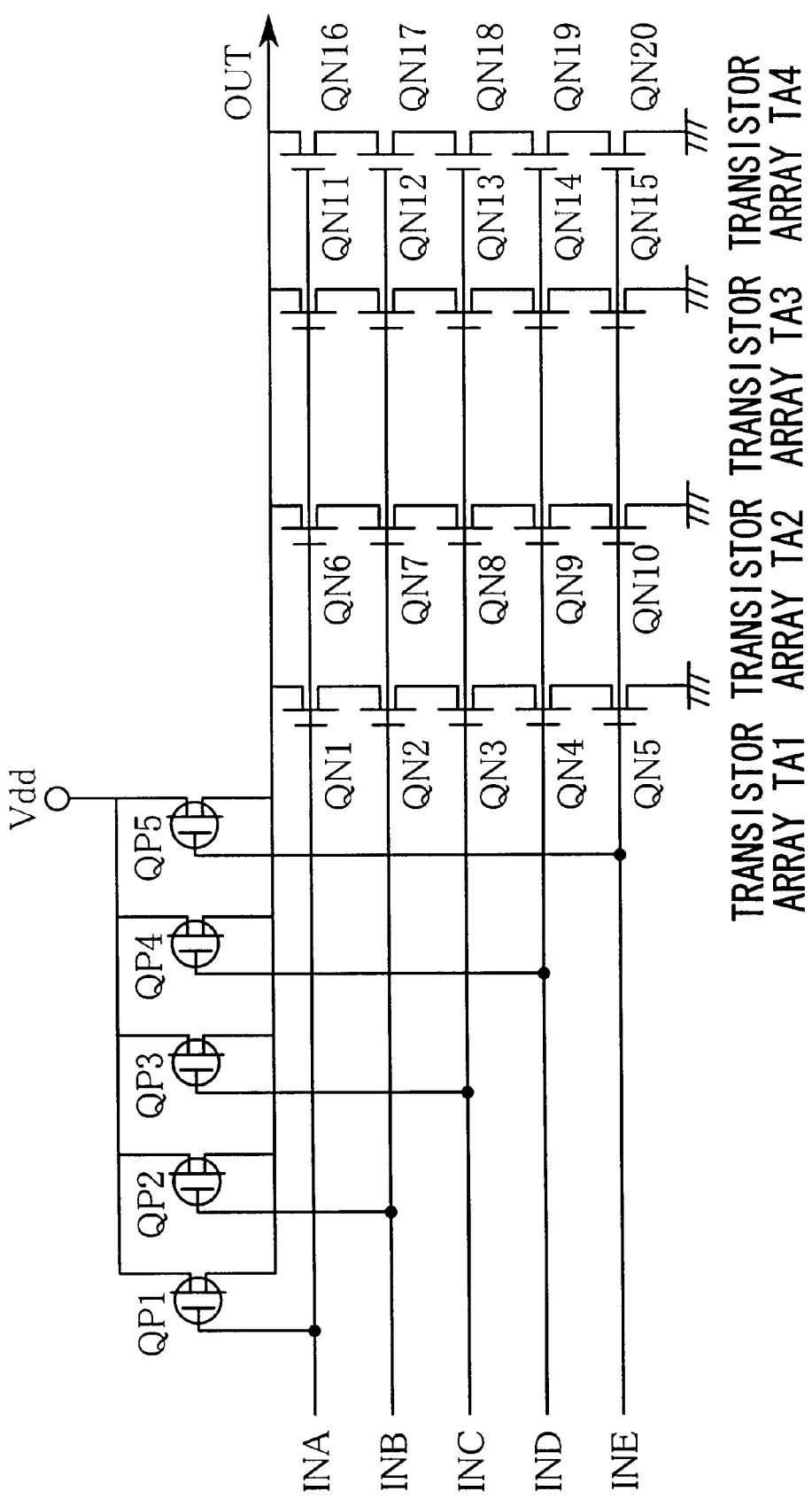
FIG. 7 is a circuit diagram showing the five-input NAND circuit of the third embodiment of the present invention.

The five-input NAND circuit, which is the third embodiment of the present invention, will be explained with reference to FIG. 7. In this figure, INA to INE are input terminals to the five-input NAND circuit, and OUT is an output terminal from the five-input NAND circuit. Further, QP1 to QP5 are Pch transistors, and QN1 to QN20 are Nch transistors.

The Pch transistors QP1 to QP5 are connected in parallel to each other between the source voltage Vdd and the output terminal OUT. That is, the sources of QP1 to QP5 are connected to the source voltage Vdd, and the drains of QP1 to QP5 are connected to the output terminal OUT. The gates of QP1, QP2, QP3, QP4, and QP5 are connected to five input terminals INA, INB, INC, IND, and INE, respectively.

The Nch transistors QN1 to QN5 are connected in series, forming a transistor array TA1. In the transistor array TA1, the source of QN1 is connected to the drain of QN2, the source of QN2 is connected to the drain of QN3, the source of QN3 is connected to the drain of QN4, and the source of QN4 is connected to the drain of QN5.

The transistor array TA1 is connected between the output terminal OUT and GND. That is, the drain of QN1 is connected to the output terminal OUT, and the source of QN5 is connected to GND.

Similarly, the Nch transistors QN6 to QN10 form a transistor array TA2. The transistor array TA2 is connected between the output terminal OUT and GND. Further, the Nch transistors QN11 to QN15 form a transistor array TA3, which is connected between the output terminal OUT and GND. Further, the Nch transistors QN16 to QN20 form a transistor array TA4, which is connected between the output terminal OUT and GND.

The input terminal INA is connected to the gates of the Nch transistors QN1, QN6, QN11, and QN16, which are the nearest to the output terminal OUT. The input terminal INB is connected to the gates of the Nch transistors QN2, QN7, QN12, and QN17. The input terminal INC is connected to the gates of the Nch transistors QN4, QN8, QN13, and QN18. The input terminal IND is connected to the gates of the Nch transistors QN4, QN9, QN14, and QN19. The input terminal INE is connected to the gates of the Nch transistors QN5, QN10, QN15, and QN20.

Next, the layout of the embodiment on the IC will be explained with reference to the layout diagram of FIG. 8. On the IC, the transistor arrays TA1 to TA4 are aligned in a line.

Figure 8:
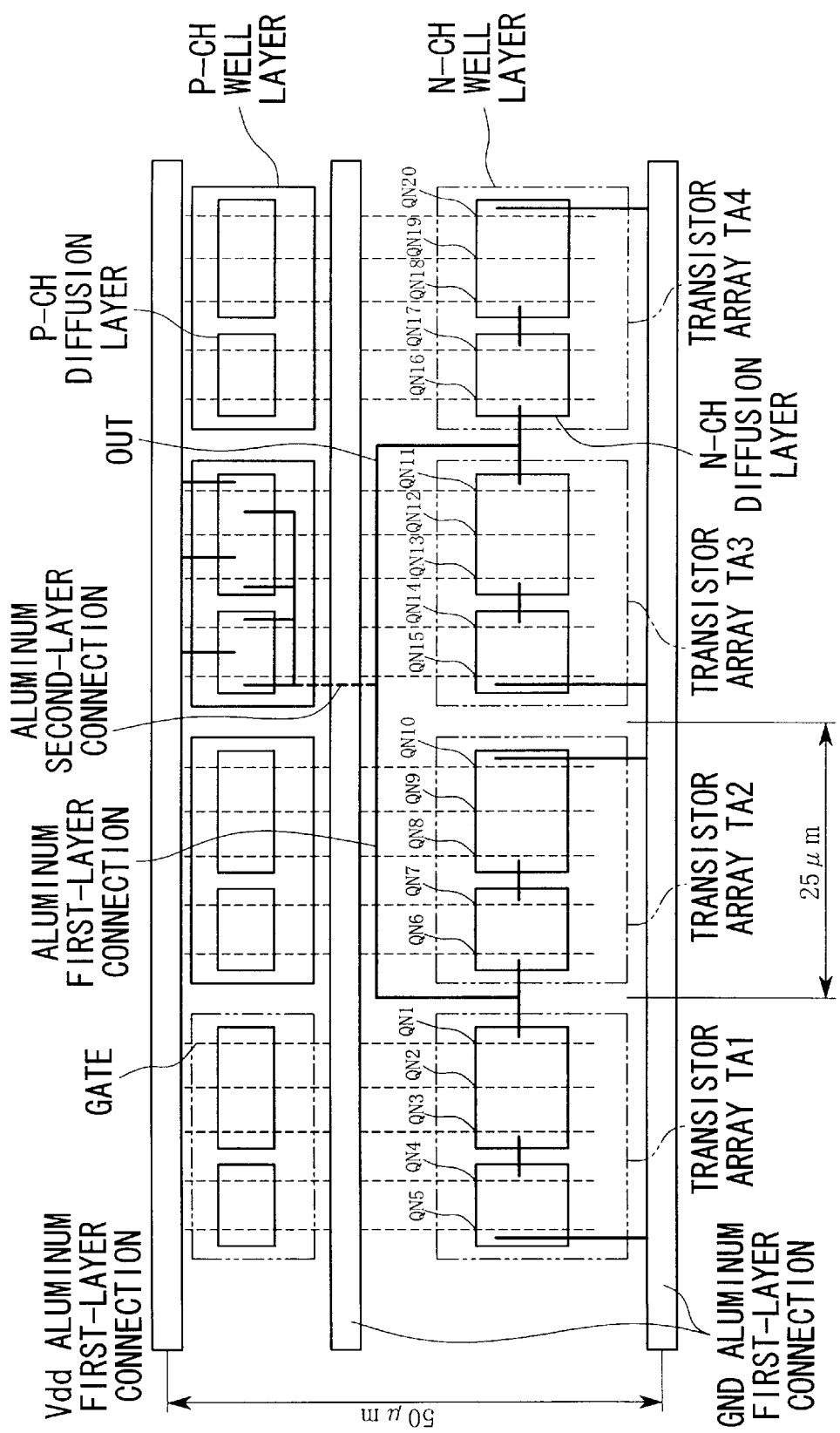
FIG. 8 is a diagram showing the layout of the five-input NAND circuit of the third embodiment of the present invention.

In the transistor array TA1, the Nch transistors are arranged in the order QN5, QN4, QN3, QN2, and QN1 from the left of FIG. 8. In the transistor array TA2, the Nch transistors are arranged in the order QN6, QN7, QN8, QN9, and QN10 from the left of FIG. 8. In the transistor array TA3, the Nch transistors are arranged in the order QN15, QN14, QN13, QN12, and QN11 from the left of FIG. 8. In the transistor array TA4, the Nch transistors are arranged in the order QN16, QN17, QN18, QN19, and QN20 from the left of FIG. 8. That is, QN1 to QN20 are aligned in a line. The transistor arrays TA1 to TA4 are formed in separated well areas.

The source area of the transistor QN5 in the transistor array TA1 is connected via an aluminum first-layer connection to a GND first-layer connection. The drain area of QN5 is in the same diffusion area as the source area of QN4, which is located next to QN5. The drain area of QN4 is connected to the source area of the next QN3 by a single aluminum first-layer connection.

The drain area of QN3 is in the same as the source area of the next QN2, and the drain area of QN2 is in the same diffusion area as the source area of the next QN1. The drain of QN1 is connected to the drain area of QN6 in the next transistor array TA2 by a single aluminum first-layer connection and to the output terminal OUT by a single aluminum first-layer connection.

The source area of QN6 is in the same diffusion area as the drain area of the next QN7. The source area of QN7 is connected to the drain area of the next QN8 by a single aluminum first-layer connection. The source area of QN8 is in the same diffusion area as the drain area of the next QN9. The source area of QN10 is connected to the GND aluminum first-layer connection by a single aluminum first-layer connection.

The arrangement of the transistors in the transistor array TA3 is similar to that of the transistor array TA1, and the arrangement of the transistors in the transistor array TA4 is similar to that of the transistor array TA2.

Thus, the terminals of four transistor arrays TA1 to TA4 connected to the GND terminal are located at both ends of and in the middle of the line of the transistor arrays TA1 to TA4. The aluminum first-layer connection from the output terminal OUT to the transistor arrays TA1 to TA4 is shortened. Of five Nch transistors connected in a line in the transistor arrays, pairs of drains and sources of the transistors close to each other are common, the aluminum connection between each pair of the transistors is single, and connections at both ends of the junction of each transistor. Therefore, when only the input terminal INE is changed from the L level to the H level, the length of the discharge area of the aluminum first-layer connection is 135 μm, which corresponds to 27 fF. Since the total junction capacity of the transistors for the discharge is 72 fF, the total discharge is 99 fF.

Because the total discharge of 99 fF is 65% of 152 fF, which is the total discharge from the conventional five-input NAND circuit, the output level changing time tpd is accelerated to 1.5 times.

Figure 9:
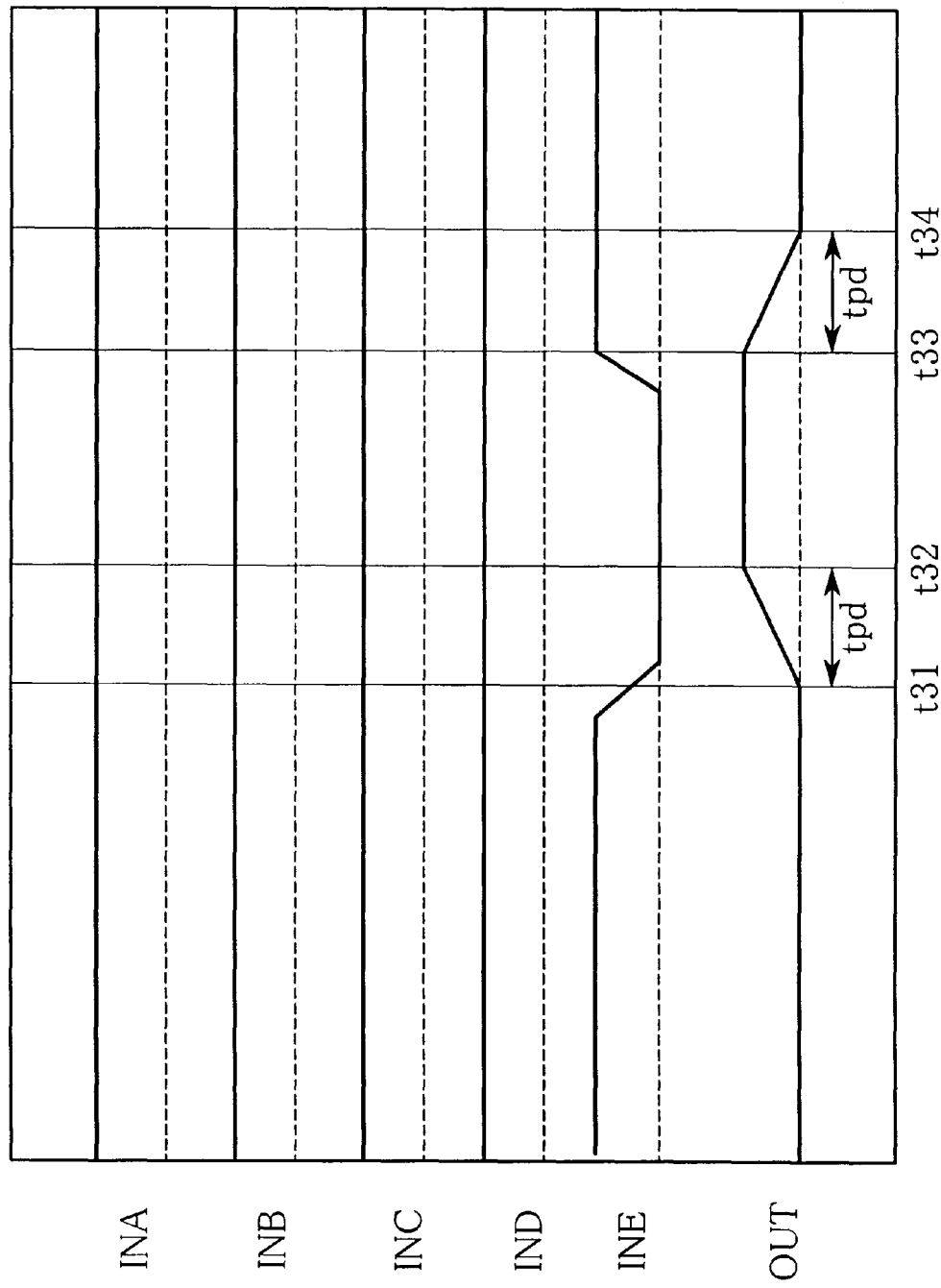
FIG. 9 is a timing chart showing the operation of the five-input NAND circuit of the third embodiment of the present invention.
Figure 10:
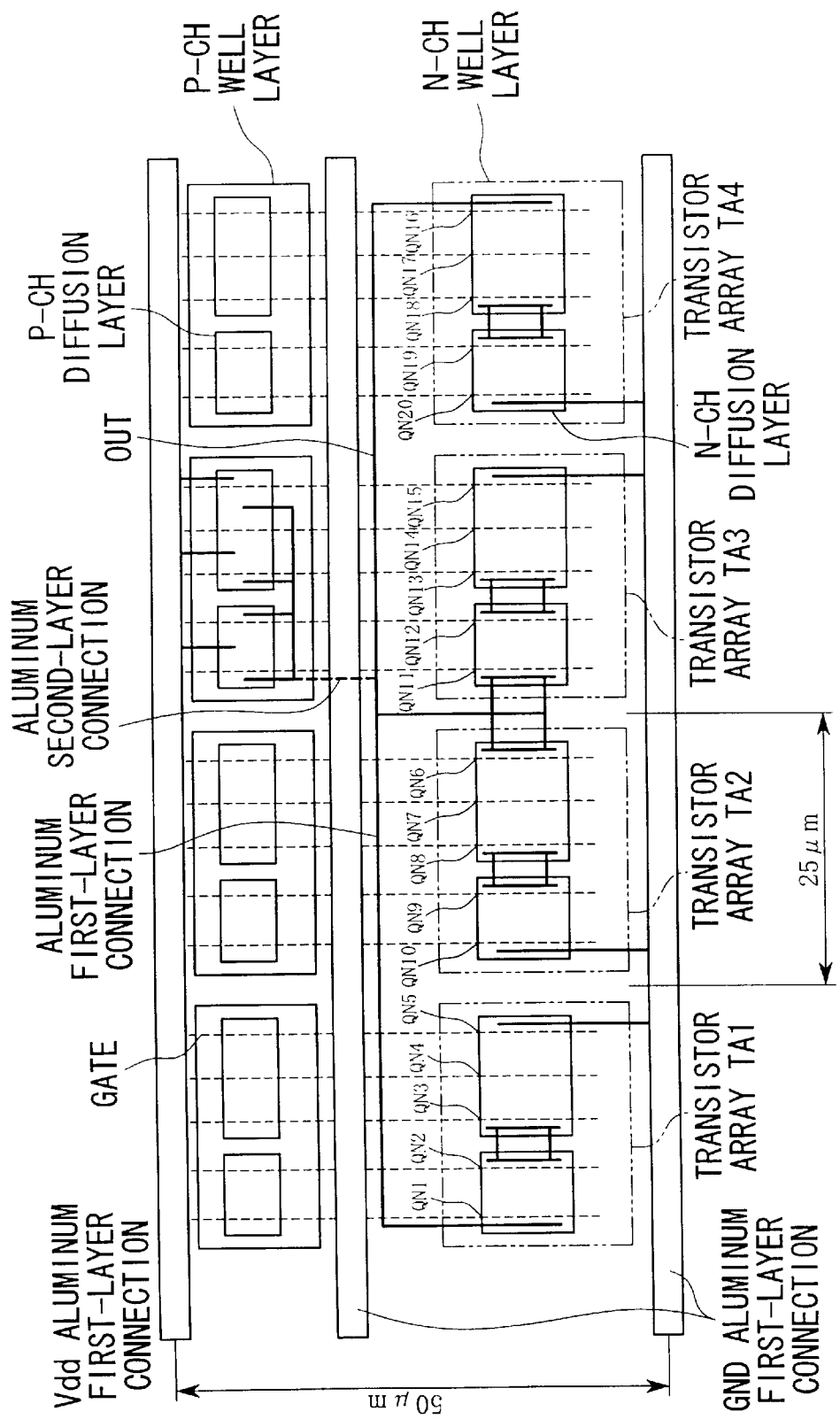
FIG. 10 is a diagram showing the layout of the five-input NAND circuit of the conventional technique.
Figure 11:
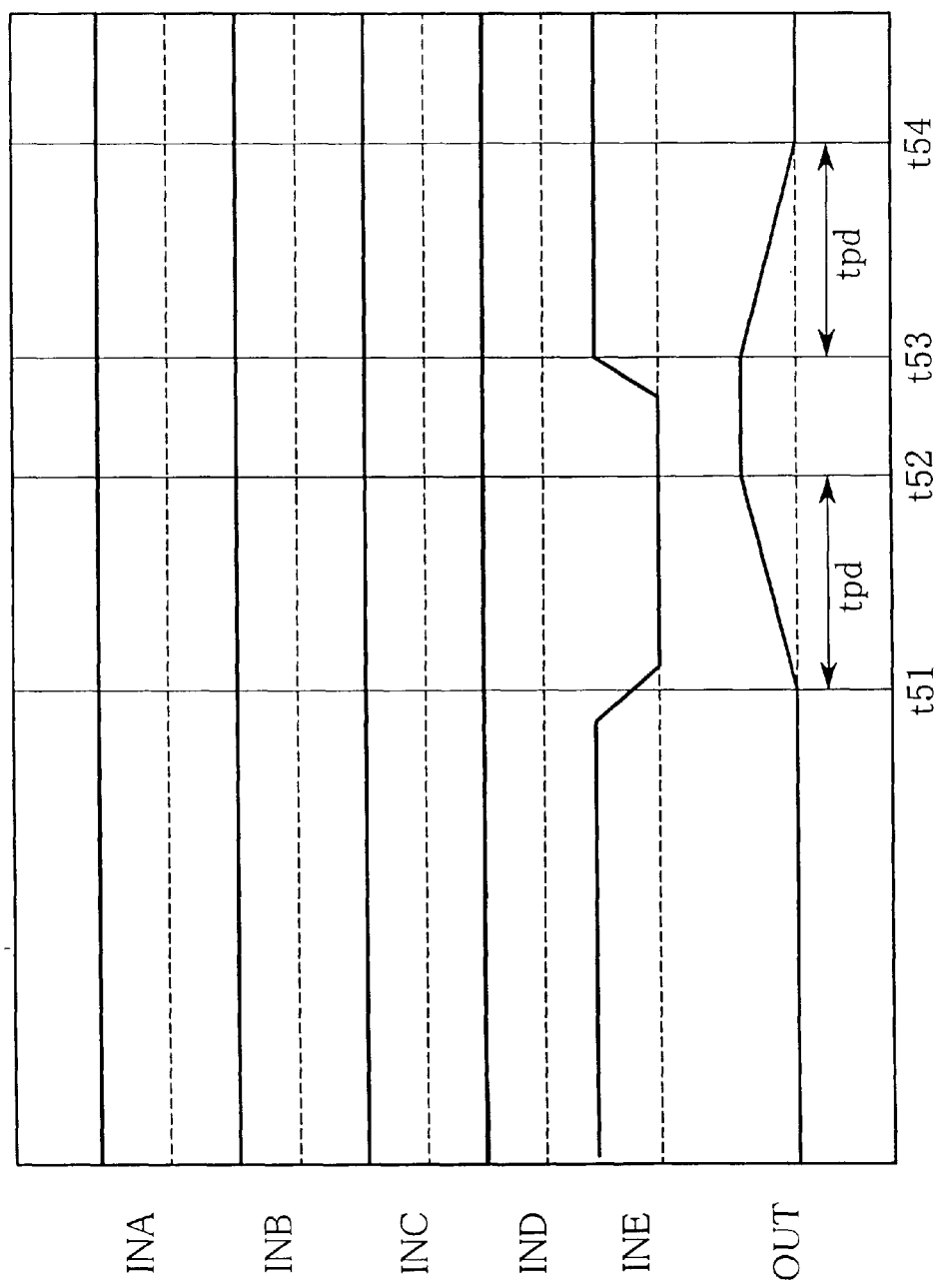
FIG. 11 is a timing chart showing the operation of the five-input NAND circuit of the conventional technique.

The operation of this embodiment will be explained with reference to FIG. 9. At the point of time t31, when the input terminal INE is inverted from the H level to the L level, the output terminal OUT is inverted from the L level to the H level from t31 to t32. At the point of time t33, when the input terminal INE is inverted from the L level to the H level, the output terminal OUT is inverted from the H level to the L level from t33 to t34.

When the output level is changed, the total electric charge or discharge is 99 fF, which corresponds to 65% of the electric charge or discharge of 152 fF of the conventional five-input NAND circuit, and the output level changing time tpd is accelerated to 1.5 times.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A logic product circuit comprising:

a plurality of transistors arranged in a matrix of a plurality of columns and a plurality of rows;

a plurality of input terminals;

a single output transistor; and a single output terminal connected to the output transistor, wherein the transistors in each of the plurality of columns are connected in a line, forming a transistor array;

the transistor arrays are connected in parallel so that the transistors form rows, one of the rows of the transistors is connected between the input to the output transistor and the ground, another row of the transistors is connected between the output terminal and the ground, the input terminals are connected to the input to the transistors in all the columns, and the transistors to which each input terminal is connected are arranged in different rows.

2. A logic product circuit according to claim 1, wherein the number of the transistors in each of the respective rows is the same.

3. A logic product circuit according to claim 1, wherein the transistors are MOSFETs.

4. A logic product circuit according to claim 1, wherein the transistors are junction field effect transistors.

5. A logic product circuit according to claim 1, wherein the output transistor is a bipolar transistor.

6. A logic product circuit comprising:

a plurality of transistors arranged in a matrix of a plurality of columns and a plurality of rows;

a plurality of input terminals; and a single output transistor, a single output terminal, wherein the transistors in each column are connected in a line, forming a transistor array;

the transistor arrays are connected in parallel between the output terminal and the ground;

each of the input terminals is connected to the transistors in all the columns, and the transistors of the transistor arrays connected to the output terminal are adjacent to each other on an IC.

7. A logic product circuit according to claim 6, wherein the transistors forming the transistor arrays are N-channel MOS transistors.

8. A logic product circuit according to claim 6, wherein all the transistors in the transistor arrays are arranged in a single line on the IC, a connection from the output terminal is provided in the middle of the line of the transistors, and the terminals at the both ends of the line of the transistors are connected to the ground.

9. A logic product circuit according to claim 6, wherein at least some of the neighboring transistors in the transistor arrays on the IC are connected without an aluminum connection.

10. A logic product circuit according to claim 9, wherein at least some of the sources and drains of the transistors on the IC are within the same diffusion areas.

* * * * *